(12) United States Patent
Ryan

(10) Patent No.: US 6,883,012 B1
(45) Date of Patent: Apr. 19, 2005

(54) LINEAR-TO-LOG CONVERTER FOR POWER ESTIMATION IN A WIRELESS DATA NETWORK RECEIVER

(75) Inventor: Philip J. Ryan, Stanmore (AU)

(73) Assignee: Cisco Systems Wireless Networking (Australia) Pty Limited, North Sydney (AU)

( * ) Notice: Subject to any disclaimer, the term of this patent is extended or adjusted under 35 U.S.C. 154(b) by 576 days.

(21) Appl. No.: 10/015,486

(22) Filed: Dec. 11, 2001

Related U.S. Application Data

(60) Provisional application No. 60/283,609, filed on Apr. 13, 2001, provisional application No. 60/277,370, filed on Mar. 19, 2001, provisional application No. 60/322,596, filed on Sep. 14, 2001, and provisional application No. 60/322,382, filed on Sep. 14, 2001.

(51) Int. Cl.[7] .............................. G06F 1/02; G06F 7/38
(52) U.S. Cl. ...................................... 708/277; 708/518
(58) Field of Search .............................. 708/277, 518; 341/75

(56) References Cited

U.S. PATENT DOCUMENTS

| | | | |
|---|---|---|---|
| 4,078,250 A | 3/1978 | Windsor et al. ............ 364/715 |
| 4,614,935 A | 9/1986 | Fling .......................... 340/347 |
| 4,626,825 A | 12/1986 | Burleson et al. ............ 340/347 |
| 4,682,152 A | 7/1987 | Okamoto et al. ........... 340/347 |
| 4,710,772 A | 12/1987 | Cantwell et al. .............. 342/92 |
| 5,363,321 A | 11/1994 | Dao Trong et al. ...... 364/748.5 |
| 5,524,089 A | 6/1996 | Takano .................... 364/748.5 |
| 5,629,884 A | 5/1997 | Pan et al. ................ 364/748.5 |
| 5,642,305 A | 6/1997 | Pan et al. ................ 364/748.5 |
| 5,771,391 A * | 6/1998 | Lloyd et al. ................ 708/277 |
| 5,831,878 A | 11/1998 | Ishida ........................ 364/722 |
| 5,944,774 A | 8/1999 | Dent .......................... 708/517 |
| 5,951,629 A | 9/1999 | Wertheim et al. ........... 708/517 |
| 6,000,835 A | 12/1999 | Pan et al. ................... 364/768 |
| 6,065,031 A | 5/2000 | Pan et al. ................... 708/517 |

* cited by examiner

*Primary Examiner*—Tan V. Mai
(74) *Attorney, Agent, or Firm*—Dov Rosenfeld; Inventek

(57) ABSTRACT

A converter to convert an N-bit input in a linear scale to an M-bit output in a logarithmic scale. The converter includes a set of K subrange converters each coupled to a respective number of bits of the N-bit input that represents a subrange of the N-bit input, each subrange converter to convert the subrange into a respective output that would be the M-bit output if the most significant set bit in the N-bit input was in the subrange. The converter further includes a range selector having the N-bit input as an input, to indicate which of the subranges to select for an output, and a selector having as inputs the outputs of the subrange converters and coupled to the range selector to select the output of one of the subrange converters as the M-bit output. In one embodiment, the converters operate in parallel.

21 Claims, 5 Drawing Sheets

LINEAR-TO-LOG CONVERTER FOR POWER ESTIMATION IN A WIRELESS DATA NETWORK RECEIVER

RELATED PATENT APPLICATIONS

This invention claims priority of the following U.S. provisional patent applications:

Ser. No. 60/277,370 entitled SYSTEM USING SINGLE CHIP WIRELESS LAN MODEM AND SINGLE CHIP RADIO TRANSCEIVER AND APPARATI, METHODS, AND SOFTWARE PRODUCTS USED THEREIN OR THEREWITH, filed: Mar. 19, 2001.

Ser. No. 60/283,609, titled WIRELESS COMMUNICATION SYSTEM, filed: Apr. 13, 2001.

Ser. No. 60/322,596 entitled LINEAR-TO-LOG CONVERTER FOR POWER ESTIMATION IN A WIRELESS DATA NETWORK RECEIVER, filed: Sep. 14, 2001.

Such provisional patent applications are incorporated herein by reference.

This invention is also related to U.S. provisional patent application 60/322,382 entitled AUTOMATIC GAIN CONTROL AND LOW POWER START-OF-PACKET DETECTION FOR A WIRELESS LAN RECEIVER to inventors Ryan et al., filed Sep. 14, 2001, incorporated herein by reference.

BACKGROUND

This invention is related to logarithmic conversion, and in particular to power measurement in a wireless receiver using a device that converts power measurements in a linear scale to a logarithmic scale to reduce the number of bits required to define the dynamic range.

Automatic gain control (AGC) for radio receivers is well known and widely used. In general, AGC is straightforward for systems that receive signals of approximate constant amplitudes. Communication in a wireless data network is packet-by-packet ("packetized"). Furthermore, packets might arrive simultaneously from several radio transmitters, so each set of packets from a particular transmitter requires its own gain setting. Furthermore, a wireless receiver does not know when packets start. Furthermore, the high data rates of newer wireless data networks lead to problems when trying to include AGC in receivers.

Thus there is a need for fast and accurate AGC. Such fast and accurate AGC requires an estimate of the power of a received signal. A radio receiver produces received signals and may be digitized using one or more analog-to-digital converters (ADCs). The instantaneous and average power may be calculated from samples of received signals, and the average power then used to determine the correct gain setting. In some applications, an average power to gain setting lookup table may be used for such gain determination. The average power, however, is usually available in a linear scale. To obtain accurate gain setting over the complete dynamic range may require a lookup table of prohibitive size. Converting the average power to a compressed scale, for example to a logarithmic scale is thus desirable. One example of a logarithmic scale is decibels (dB).

Thus there is a need for a fast and accurate device to convert numbers in a linear scale to numbers in a logarithmic scale, in particular for implementation for converting power measurements in a radio receiver.

Wireless data networks are beginning to be widely implemented. The EEE-802.11 a is one standard for a wireless local area network for data transmission up to 54 Mbits/s (Mbps). Such a high data rate requires accurate and fast AGC.

Radios-on-a-chip and accompanying modulator-demodulators (modems) on a chip are now being promoted by several companies, e.g., Atheros Communications (Sunnyvale, Calif.) which markets its AR5000 chipset, as does the assignee of the present invention. Such chips put complete 5.15–5.35 GHz transceivers on a chip and complete COFDM modems on another chip, and these chipsets need only a few external filters, a transmit/receive switch and a crystal to operate.

Thus there is a need for a fast and accurate device to convert numbers in a linear scale to numbers in a logarithmic scale, in particular for implementation for converting power measurements in a radio receiver and/or radio implemented on a chip. In particular, there is a need for a method and circuit that achieves linear to logarithmic conversion in a manner compliant with the IEEE 802.11a and similar standards.

For more information on the IEEE 802.11 and IEEE 802.11 a standard, see: ANSI/EEE Std 802.11, 1999 Edition (ISO/IEC 8802-11:1999) Local and metropolitan area network—Specific Requirements—Part 11: Wireless LAN Medium Access Control (MAC) and Physical Layer (PHY) Specifications, and IEEE Std 802.11a-1999 [ISO/IEC 8802-11:1999/Amd 1:2000(E)] (Supplement to IEEE Std 802.11, 1999 Edition) Part 11: Wireless LAN Medium Access Control (MAC) and Physical Layer (PHY) specifications: High-speed Physical Layer in the 5 GHz Band. The standards are available on the Internet at http://www.manta.ieee.org/groups/802/11/.

SUMMARY

Disclosed herein is a converter to convert an N-bit input in a linear scale to an M-bit output in a logarithmic scale. The converter includes a set of K subrange converters each coupled to a respective number of bits of the N-bit input that represents a subrange of the N-bit input, each subrange converter to convert the subrange into a respective output that would be the M-bit output if the most significant set bit in the N-bit input was in the subrange. The converter further includes a range selector having the N-bit input as an input, to indicate which of the subranges to select for an output, and a selector having as inputs the outputs of the subrange converters and coupled to the range selector to select the output of one of the subrange converters as the M-bit output. In one embodiment, the converters operate in parallel.

Also disclosed is a method of converting an N-bit input in a linear scale to an M-bit output in a logarithmic scale. The method includes dividing the input range into a set of K subranges each defined by a number of bits of the N-bit input, converting each of the subranges into a respective output that would be the M-bit output if the most significant set bit in the N-bit input was in the subrange, determining from the N-bit input an indication of which of the subranges to select for an output, and selecting the output of the converting step for the selected output as the M-bit output.

Other objects, features, and aspects of the invention will be apparent from the detailed description herein.

DETAILED DESCRIPTION

Figure 1:
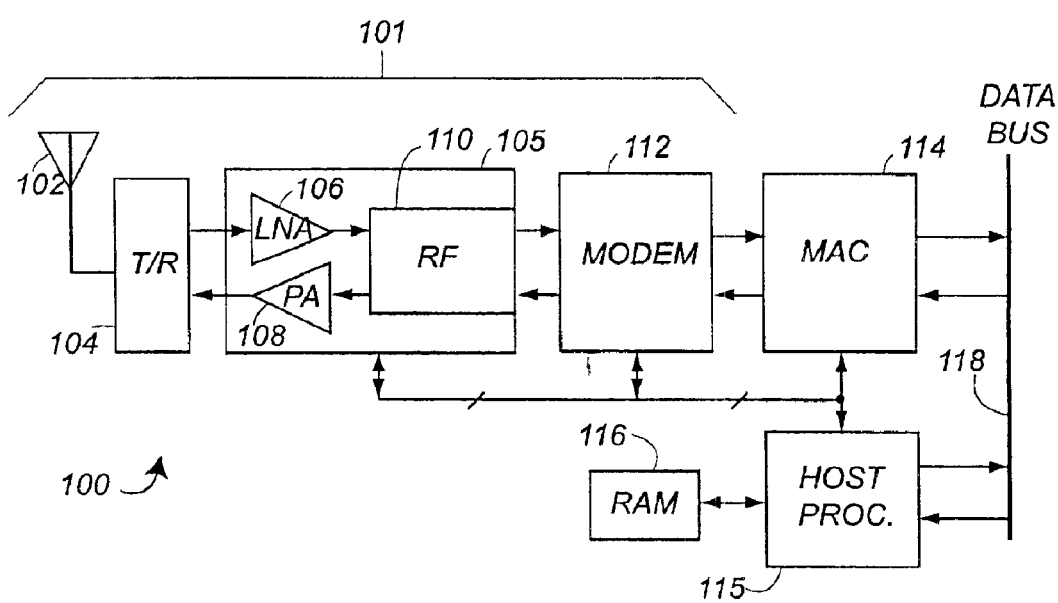
FIG. 1 is a functional block diagram of a wireless communication system 100 that includes an embodiment of the present invention.

FIG. 1 is a functional block diagram of a wireless communication system 100 that includes an embodiment of present invention. The system 100 might be, for example, part of a PCMCIA wireless LAN card embodiment, and includes a physical layer interface (PHY) 101 that includes at least one antenna 102 for 5 G Hz carrier service, a transmit/receive (TIR) switch 104 for half-duplex operation, and a wireless transceiver 10 such as that of FIG. 1 that includes a low-noise amplifier (LNA) 106, a power amplifier (PA) 108, and other radio frequency (RF) transceiver components as described herein. The physical layer also includes a data modem 112. The system 100 further includes a media access controller (MAC) 114 for layer-2 processing. A computer system databus 118 is accommodated. Interfaces may be included e.g., one or more interfaces that conform to well-known industry standards PCMCIA, PCI, USB, and so forth.

One optional component is a host processor 115. The host processor function may, for example be incorporated with the MAC 114. A random access memory (RAM) 116 is included for data buffering and program storage. The RAM 116 may be directly coupled to the host or to the MAC or to both.

In addition to the radio data between the modem, radio transceiver, and MAC, control information such as gain settings for the radio receiver from an automatic gain control module in the modem, and other data, may be communicated between the host (if included), the MAC, the modem and the wireless transceiver.

Antenna diversity is preferred in some applications, e.g., two or more transmit antennas or two or more receive antennas or multiple antennas for both the receive and transmit mode. Diversity switching and access-point clever diversity combining will also help in signal-fading environments.

The system 100 preferably is implemented to be compatible with the IEEE-802.11 a standard for wireless local area network (LAN) applications. The RF transceiver 110 and modem 112 constitute a complete wireless engine for OSI Layer-1 physical layer (PHY) functionality in broadband wireless LAN's. The (MAC) 114 is IEEE-802.11-compliant for layer-2 processing. Supportable data rates have been tested to exceed 54 Mbits/second.

Given the present state of semiconductor technology development, the system 100 preferably is constructed on a single printed circuit board (PCB) and the RF transceiver 10 and modem 112 are each implemented with CMOS technology in individual integrated circuits. The present inventors have discovered that 0.25-micron CMOS technology is practical for use in implementations of the modem 112, and 0.18-micron CMOS technology for the RF transceiver 110. One such silicon foundry that has the capability to manufacture such parts is Taiwan Semiconductor Manufacturing Co., Ltd.

The Modem Chip

Figure 2:
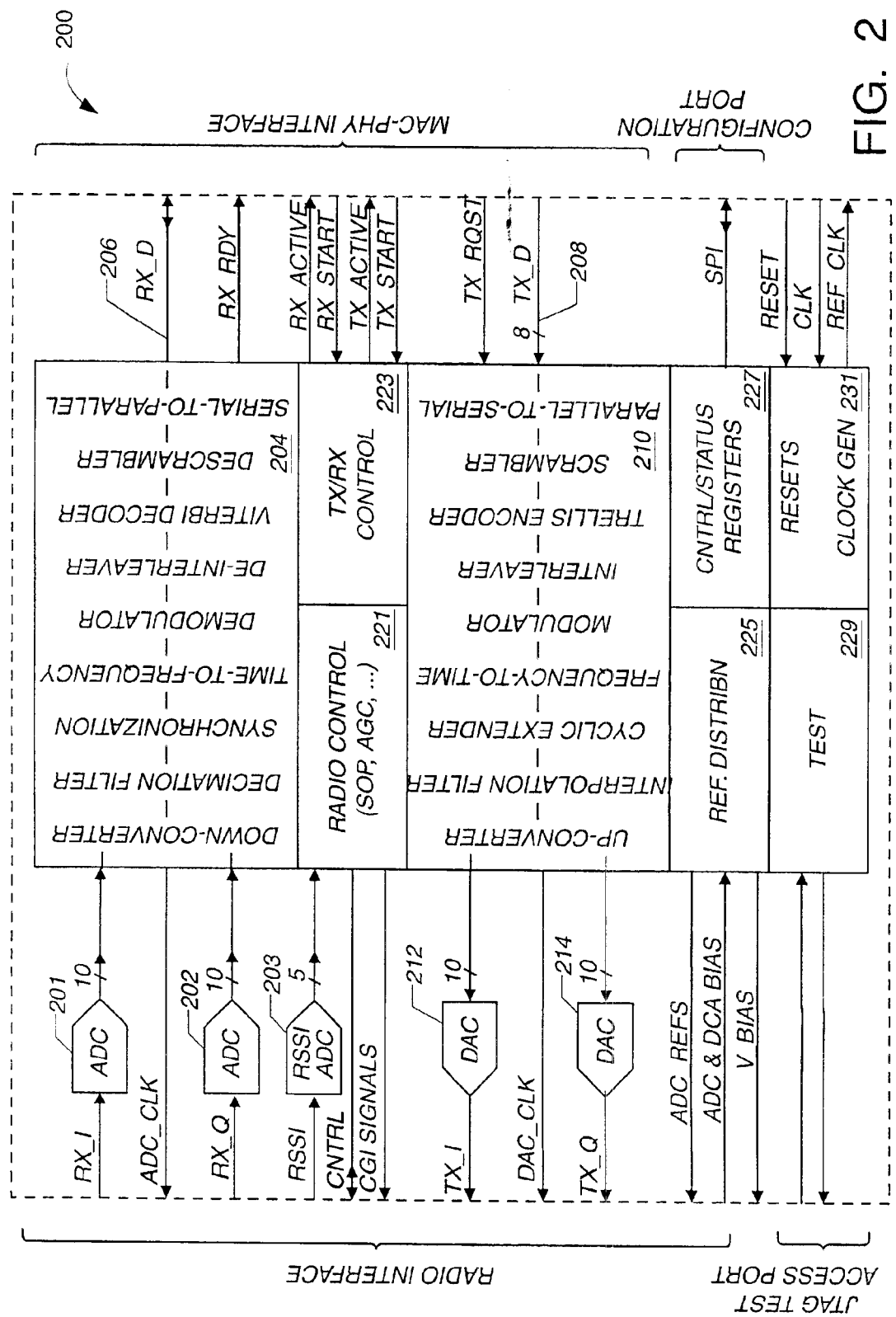
FIG. 2 shows a block diagram of a modem integrated circuit that includes an embodiment of the present invention.

FIG. 2 shows in simplified block diagram form, an embodiment 200 of the modem chip that can operate with the transceiver chip and that includes an embodiment of the present invention. ADCs 201 and 202 accept fully differential I-and Q-analog signals from one embodiment of the transceiver chip, or one of the ADCs accepts a single differential signal from a single sideband embodiment of the transceiver chip. The receive signal processor 204 accepts the digitized receive signals from ADCs 201 and 202 and carries out the following operations: down-conversion, anti-alias filtering, OFDM symbol synchronization, time-to-frequency conversion, sub-carrier demodulation, de-interleaving, the inventive Viterbi decoding, descrambling, and serial-to-parallel conversion. The output 206 of the receive processor 204 goes to an off-chip MAC processor.

The receive input of modem 200 can interface to two basic receiver configurations.

1. A quadrature radio receiver with baseband I- and Q-differential outputs that are sampled at 40 Ms/s by the ADCs. In such a case the ADC outputs are filtered by 2:1 decimating filters in the receiver signal processor 204.

2. A bandpass IF radio receiver with real bandpass IF differential output centered at 20 MHz. The analog input from the transceiver chip is sampled at 80 Ms/s by one ADC and an internal IQ down-converter in processor 204 generates baseband I and Q channel outputs. The decimating filters are configured as a 4:1 decimating low-pass filters.

In one embodiment, the transmit and receive data paths in modem 200 are completely independent, allowing full duplex as well as half-duplex operation.

Note that another embodiment of the modem chip is only for implementation with a bandpass IF radio receiver, so that only a single differential ADC, rather than the two ADCs 201 and 202 shown in FIG. 2 is included for the receive path. The analog input from the transceiver chip is sampled at 80 Ms/s by that ADC and an internal IQ down-converter with decimation filters in processor 204 generates baseband I and Q channel outputs. The decimating filters are configured as a 4:1 decimating low-pass filters.

The to-be-transmitted signal 208 from the MAC is input to a transmit processor 210 that performs parallel-to-serial conversion, scrambling, encoding, bit-interleaving, sub-carrier modulation, OFDM time symbol generation, cyclic extension, filtering and up-conversion. The resulting digital signals are converted to analog I- and Q-signals by digital-to-analog converters 212 and 214. These analog signals are input to the transceiver chip.

The architecture shown in FIG. 2 supports all the raw data rates and modulation schemes specified by IEEE 802.11a, mandatory and optional, plus three additional proprietary configurations.

In one embodiment, operation of the modem 200 is controlled and monitored by a set of 48–16-bit control and status registers that are accessed via a 4-pin Serial Peripheral Interface (modem SPI).

The radio receiver is controlled by radio control block 221 that includes start-of-packet (SOP) detection and automatic gain control (AGC) for dynamically setting the gains and the performance of the transceiver. The SOP and AGC functions may be as described in above-mentioned U.S. patent application 60/322,382 to inventors Ryan et al., and includes an embodiment of the present invention. The receive and transmit functions of the modem are controlled by an RX/TX control block 223 that both provides controlling the function of the modem under control of the off-chip MAC controller and that provides control signals to the off-chip MAC controller.

The modem also includes a modem gain control interface (modem GCI) in radio control 221 that outputs gain parameters to a radio receiver. The gain control interface is a serial transmit-only port for setting gains, used, for example to dynamically adjust transceiver receive path gain to optimize the received signal to noise ratio.

The functions of the modem of FIG. 2 are controlled by several finite state machines (FSMs). In one embodiment, a 16-bit microcontroller also is included. The AGC module of the modem of FIG. 2 that includes an embodiment of the present invention includes one of the finite state machines, called the AGC-FSM. The state machine causes the modem to adjust the receiver gains to default values, then to wait for a packet. A start of packet (SOP) event is detected by one or more methods. After the SOP, the power is roughly, i.e., coarsely measured using analog received signal strength indicator (RSSI) measurements produced by one radio receiver embodiment. The coarse measurement is used to coarsely set the radio receiver gains to bring the received signal values to within range of the ADCs 201 and 202. The received signals are now digitized at 80 Msamples/sec and downconverted to baseband. These samples are used (??)to finely measure power in order to finely set the gains of the radio receiver. An embodiment of the present invention may be used in the fine power measurement part of the modem.

Figure 3:
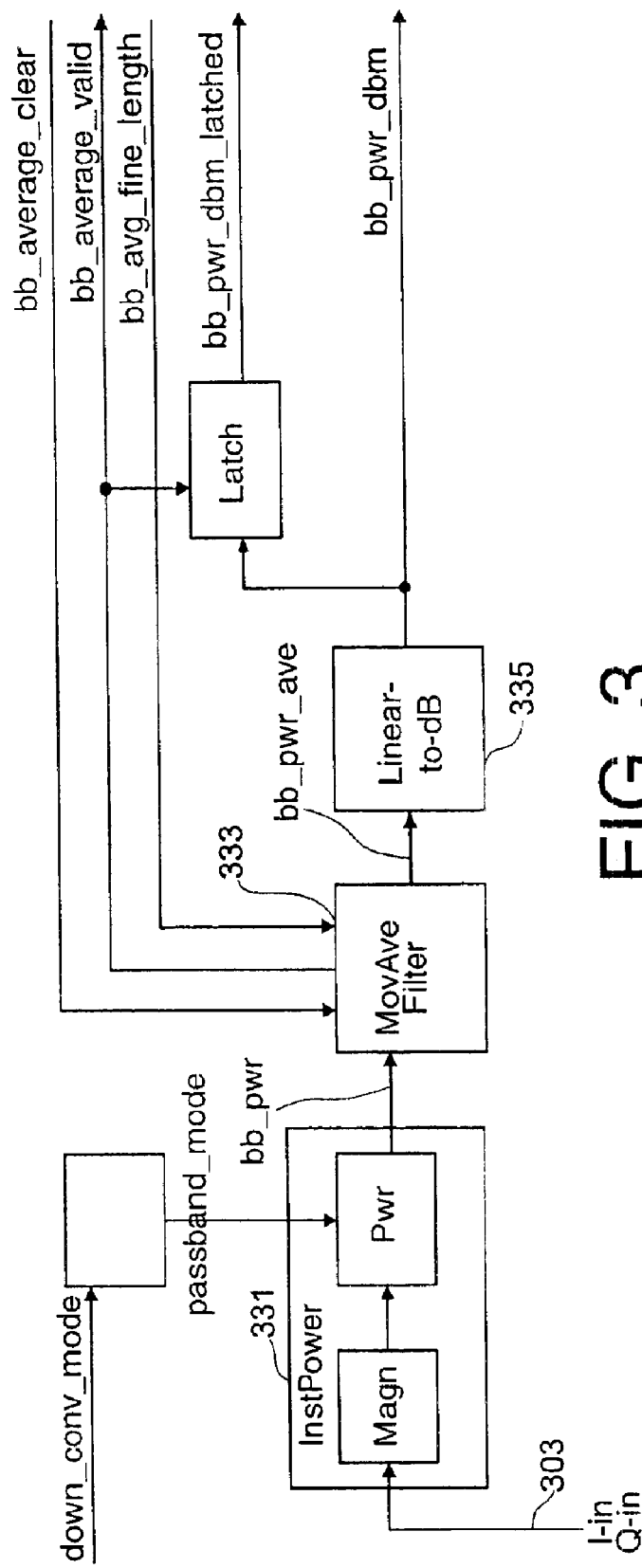
FIG. 3 shows a data path for measuring the average power in order to set the fine gains that includes an embodiment of the invention.

The measurement of the power is described with the aid of FIG. 3. In one embodiment, both the received I-signal and the received Q-signal are used, while in another, only the received I-signal is used. One embodiment provides for both types of measurements according to the value of a flag called passband_mode. The discussion will assume both I and Q being on, and it would be clear to those in the art how the I-only calculations occur. As indicated in FIG. 3, with the ADCs on, the samples of the received signal from the I-ADC 201 and Q ADC 201 and 202 are converted to power measurements by power unit 331 that determines the magnitudes of I and Q by clipping at least the sign bit, and then determines the instantaneous power bb_pwr. The power bb_pwr is averaged by a moving average filter 333 to determine the average power bb_pwr_ave. The amount of averaging in one embodiment is settable by a value bb_avg_fine_length that is determined from a register value bb_avg_length. Validity and clear signals also are used as shown.

Note that in one embodiment, power unit 331 determines the magnitude rather than the square magnitude. This is done to reduce the number of bits required.

A lookup table is used to set the fine radio receiver gains. The output of the moving average filter in one embodiment is 16-bits, and it is not practical to have a lookup table indexed by a 16-bit number. One embodiment of the invention is a linear to logarithm device 335 that maps bb_pwr_ave to an approximately logarithmic scale producing a 6-bit (64 logarithmic scale) quantity bb_pwr_dbm with steps that are separated by approximately 1 dB. The quantity bb_pwr_dbm is used to index a lookup table of gain settings, and the output of the lookup table is used to set the gains of the radio receiver.

Linear to Logarithm Conversion

One prior art technique for converting a linear quantity, assumed to be in binary form, to a logarithmic quantity is to search for the position of the most significant bit that is set in the linear number. This leading one is a coarse logarithmic indicator. For a binary number, each bit position corresponds to a 3 dB step, so such a simple technique provides for linear-to-logarithmic conversion to 3 dB accuracy.

To obtain more accuracy, the operation of determining the position of the leading one is repeated for the remainder of the number after the leading one. This can then be repeated until a sufficiently fine discrimination is obtained.

Unfortunately, such a technique requires a lot of logic and may be relatively slow. According to one aspect of the invention, the linear converter, rather than converting the whole linear range, splits the range into smaller subranges, converts each of the subranges, and then selects the result from the values generated by converting the subranges. Because the subranges are smaller than the whole range, the conversion of each subrange requires relatively little logic. The subrange conversions can occur in parallel, hence fast—in one cycle in one embodiment.

Figure 4:
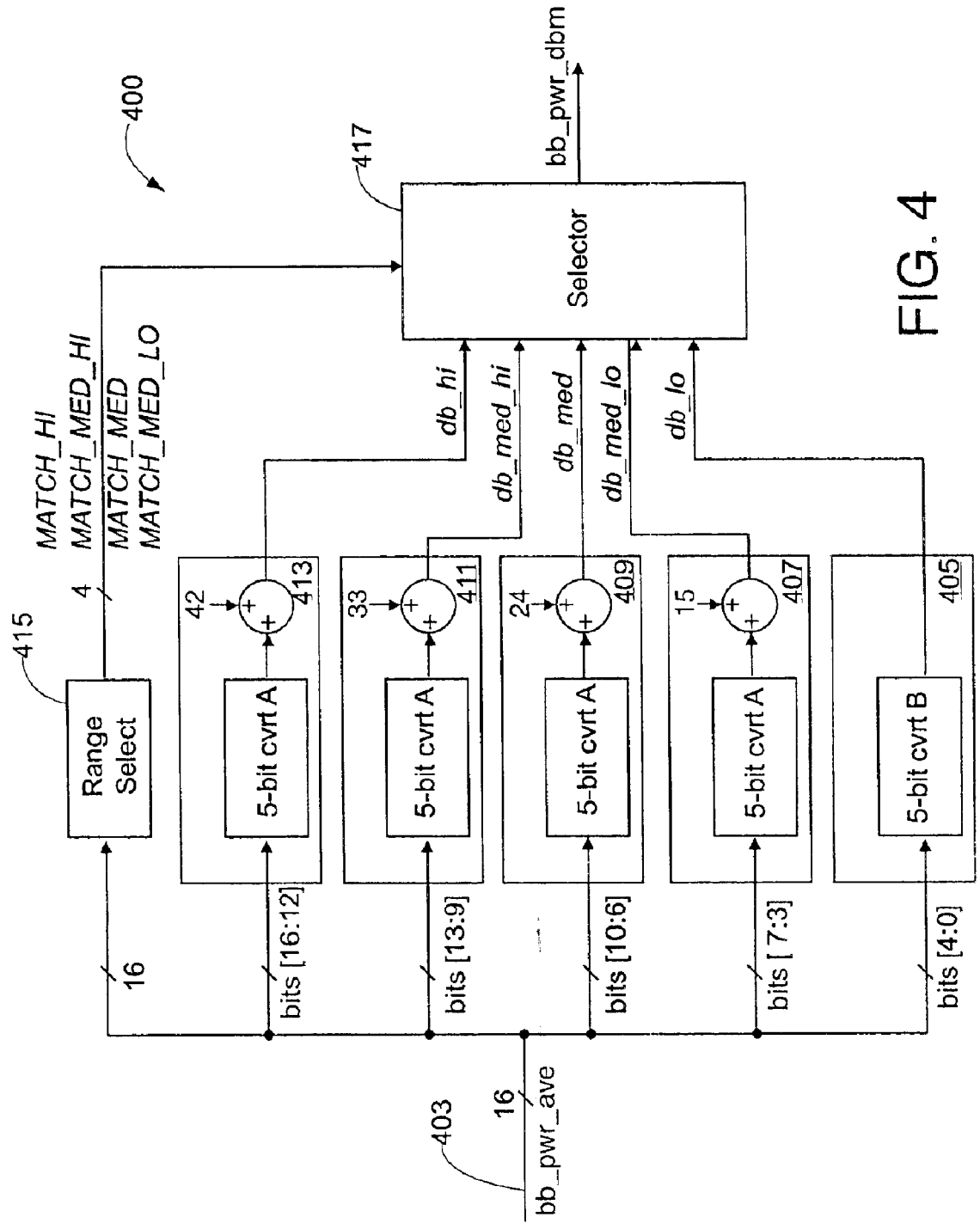
FIG. 4 shows a block diagram of a linear to logarithmic converter according to one embodiment of the invention.

FIG. 4 shows a functional block diagram of one embodiment 400 of the linear-to-log converter in which the linear power is a 16-bit quantity 403 (bb_power_ave in FIG. 3). In general, the input is an N-bit quantity. The 16-bit range is split into 5 overlapping sub-ranges specified by the bit location at which the most significant 1 lies, with the least significant bit denoted as bit 0. The subranges are bit ranges [4:0], [7:3], [10:6], [13:9], and [16:12], where bit 16 is a bit permanently set to 0, and included in one embodiment so that each range is of 5-bits of the input linear power. Each 5 bit range is input to a respective converter of a set of converters 405, 407, 409, 411, and 413, respectively, that each converts the 5-bits input to a logarithmic value as if the most significant I in the input was in the corresponding subrange. Functionally, each converter except the last, i.e., except for 405, is an instance of the same conversion defined by Table 1, below, to produce a value that when added to an offset produces the output. In one embodiment, the offsets are 15, 24, 33, and 42 for converters 407, 409, 411, and 413, respectively. In Table 1, an x indicates either a 0 or 1 input. Furthermore, in converter 413, the highest order bit is always 0.

TABLE 1

| cnvrt A | |
|---|---|
| IN[4:0] | Out |
| 11xxx | 14 |
| 101xx | 13 |
| 100xx | 12 |
| 011xx | 11 |
| 0101x | 10 |
| 0100x | 9 |
| 0011x | 8 |
| 00101 | 7 |
| 00100 | 6 |
| 000xx | 6 |

The bottom converter of FIG. 4, cvrtB 405 is defined by the following input-output table.

TABLE 2

| cnvrt B | |
|---|---|
| IN[4:0] | Out |
| 11xxx | 14 |
| 101xx | 13 |
| 100xx | 12 |
| 011xx | 11 |
| 0101x | 10 |
| 0100x | 9 |
| 0011x | 8 |
| 00101 | 7 |
| 00100 | 6 |
| 00011 | 5 |
| 00010 | 3 |
| 0000x | 1 |

A range select unit 415 operates in parallel with the 5 convert units, has the complete 16-bits of linear data as input, and outputs an indication of which range's output included selector 417 should select as the logarithmic output. In one embodiment, the output indicates which of the outputs to select, so that selector 417 is a multiplexer switch. Thus, the selector selects one of db_hi, db_med_hi, db_med, db_med_lo, or db_lo—the outputs of converters 413, 411, 409, 407, or 405, respectively.

Figure 5A:
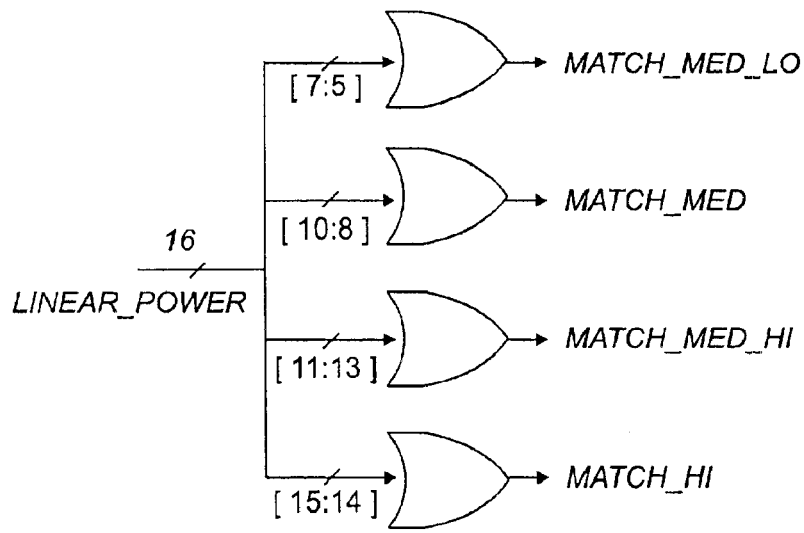
FIG. 5A shows a range select unit comprising four OR gates according to an embodiment of the invention.
Figure 5B:
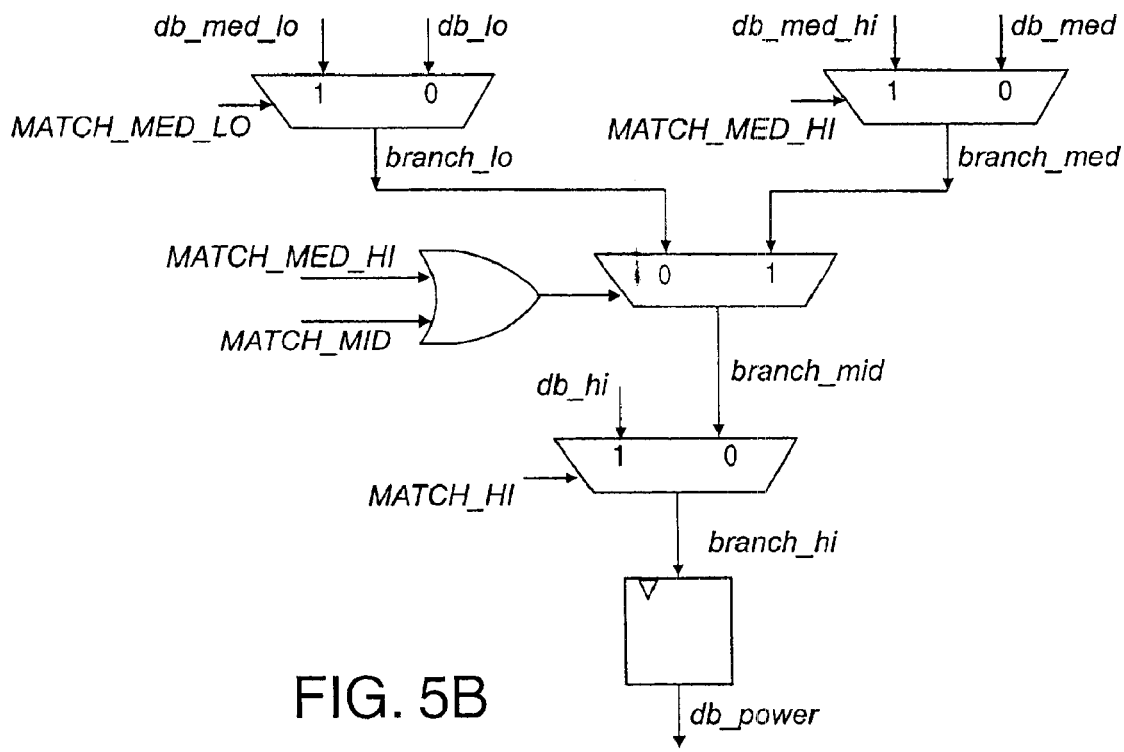
FIG. 5B shows a selector 417 works in conjunction with the range selector of FIG. 5A to select one of the subrange converter outputs as the logarithmic-scale output.

In another embodiment, shown in FIGS. 5A and 5B, the range selector has four bits, each indicating that one or more bits in selected bit ranges is set. FIG. 5A shows an implementation of such a range select unit comprising four OR gates. The four 1-bit outputs called MATCH_HI, MATCH_MED_HI, MATCH_MED, and MATCH_MED_LO, respectively, indicate if any bits in bit ranges [15:14], [11:13], [10:8], and [7:5], respectively. FIG. 5B shows an embodiment of selector 417 that works in conjunction with the range selector of FIG. 5A to select one of the subrange converter outputs db_hi, db_med_hi, db_med, db_med_lo, or db_lo as the logarithmic output.

Note that each of the converters may be implemented in many ways, including as a set of logic elements to implement the conversion directly. Alternatively, each converter may be implemented as a logic block followed by a multiplexer. The logic block converts the bits of the subrange input to a select signal for the multiplexer, and the multiplexer selects one of the outputs corresponding to either Table 1 or Table 2 but with the corresponding offset added.

In general, the input is an N-bit input, and the output is an M-bit output. The input is divided into K ranges, each range defined by a number of bits of the input. The subranges need not each be defined by the same number of bits, so the number of bits of each subrange may be denoted as $N_1$, $N_2$, ..., $N_K$, for the first, second, ..., Kth subrange, respectively, with the sum of these numbers of bits adding to N. Each of the K converters converts its input to an output as if the most significant 1 in the N-bit input was in the corresponding subrange.

In different implementations, different mappings may be defined for the subrange converters. For example, if the input is a signal magnitude rather than a signal power, the mapping may be defined to include the squaring of the signal magnitude. Furthermore, slightly different mappings than logarithmic mappings may similarly be defined. Furthermore, the number of subranges may be different in different implementations. Furthermore, the number of input bits and the number of output bits may be different in different implementations.

Thus, while some embodiments, contexts, and applications have been described herein, the invention is not limited to those embodiments, contexts, and applications.

Note that in the above description, many settable variables, flags, and tables have been described. These provide for flexibility. In one embodiment, these variables are loaded into the registers 137 in the receiver chip via the configuration port SPI. Different embodiments of the invention may have more or fewer such registers and corresponding settable parameters or flags.

Furthermore, while embodiments described herein are for an integrated circuit that includes MOS transistors, the invention is not restricted to MOS transistor circuits. Furthermore, while CMOS embodiments are described herein, the invention is not restricted to a CMOS integrated circuit.

Thus, while there has been described what is believed to be the preferred embodiments of the invention, those skilled in the art will recognize that other and further modifications may be made thereto without departing from the spirit of the invention, and it is intended to claim all such changes and modifications as fall within the scope of the invention.

What is claimed is:

1. A method of converting an N-bit input in a linear scale to an M-bit output in a logarithmic scale comprising:
   dividing the input range into a set of K subranges each defined by a number of bits of the N-bit input;
   converting each of the subranges into a respective converted output such that, for each subrange, the subrange's converted output is the M-bit output of the method for the case that the most significant bit in the N-bit input that is set is in the subrange;
   determining from the N-bit input an indication of which of the subranges to select for an output; and
   selecting the output of the converting step for the selected output as the M-bit output.

2. A method of converting as recited in claim 1, wherein the subranges are overlapping.

3. A method of converting as recited in claim 2, wherein the converting steps of the subranges occur in parallel.

4. A method of converting as recited in claim 3, wherein the determining step occurs in parallel with the converting steps.

5. A method of converting as recited in claim 2, wherein N is 16 and wherein there are 5-subranges, the four lowest order subranges comprising 5-bits of the input, and the highest subrange including 4 bits of the input.

6. A method of converting as recited in claim 2, wherein the N-bit input is an average power measurement determined from a set of samples received in a radio receiver.

7. A method of converting as recited in claim 6, wherein the M-bit output is for indexing a lookup table to set the gains of the radio receiver.

8. A converter to convert an N-bit input in a linear scale to an M-bit output in a logarithmic scale comprising:
   a set of K converting means each for converting one of K sets of bits of the N-bit input, each set of bits defining a subrange of the N-bit input, each converting means for converting its respective subrange into a respective converted output such that, for each subrange, the subrange converting means' converted output is the M-bit output for the case that the most significant bit in the N-bit input that is set is in the subrange;
   determining means having the N-bit input as an input, the determining means for indicating which of the subranges to select for an output; and
   selecting means connected to the set of determining means, the selecting means for selecting the output of the converting means for the selected output as the M-bit output.

9. A converter as recited in claim 8, wherein the subranges are overlapping.

10. A converter as recited in claim 9, wherein the converting means carry out the converting in parallel.

11. A converter as recited in claim 10, wherein the indicating means indicates in parallel with the converting of the converting means.

12. A converter as recited in claim 9, wherein N is 16 and wherein there are 5-subranges, the four lowest order subranges comprising 5-bits of the input, and the highest subrange including 4 bits of the input.

13. A converter as recited in claim 9, wherein the N-bit input is an average power measurement determined from a set of samples received in a radio receiver.

14. A converter as recited in claim 13, wherein the M-bit output is for indexing a lookup table to set the gains of the radio receiver.

15. A converter to convert an N-bit input in a linear scale to an M-bit output in a logarithmic scale comprising:

a set of K subrange converters each coupled to a respective number of bits of the N-bit input that represents a subrange of the N-bit input, each subrange converter to convert the subrange into a respective converted output such that, for each subrange, the subrange converters converted output is the M-bit output for the case that the most significant bit in the N-bit input that is set is in the subrange;

a range selector having the N-bit input as an input, to indicate which of the subranges to select for an output; and a selector having as inputs the outputs of the subrange converters and coupled to the range selector to select the output of one of the subrange converters as the M-bit output.

16. A converter as recited in claim 15, wherein the subranges are overlapping.

17. A converter as recited in claim 16, wherein the subrange converters carry out the converting in parallel.

18. A converter as recited in claim 17, wherein the range selector indicates in parallel with the converting of the subrange converters.

19. A converter as recited in claim 16, wherein N is 16 and wherein there are 5-subranges, the four lowest order subranges comprising 5-bits of the input, and the highest subrange includng 4 bits of the input.

20. A converter as recited in claim 16, wherein the N-bit input is an average power measurement determined from a set of samples received in a radio receiver.

21. A converter as recited in claim 20, wherein the M-bit output is for indexing a lookup table to set the gains of the radio receiver.

* * * * *

UNITED STATES PATENT AND TRADEMARK OFFICE
CERTIFICATE OF CORRECTION

PATENT NO. : 6,883,012 B1
DATED : April 19, 2005
INVENTOR(S) : Ryan

It is certified that error appears in the above-identified patent and that said Letters Patent is hereby corrected as shown below:

Column 1,
Line 64, kindly change "EEE-802.11 a" to -- IEEE-802.11a --.

Column 2,
Line 19, kindly change "ANSI/EEE" to -- ANSI/IEEE --.
Line 21, kindly change "network—Specific" to -- networks—Specific --.

Column 3,
Line 16, kindly change "(TIR)" to -- (T/R) --.

Column 6,
Line 23, kindly change "significant I in" to -- significant 1 in --.

Signed and Sealed this

Seventh Day of June, 2005

JON W. DUDAS
*Director of the United States Patent and Trademark Office*